United States Patent
Keh et al.

(10) Patent No.: US 7,298,937 B2
(45) Date of Patent: Nov. 20, 2007

(54) TO-CAN TYPE OPTICAL MODULE

(75) Inventors: Yong-Chan Keh, Suwon-si (KR); Mun-Kue Park, Suwon-si (KR); Doo-Sik Shin, Suwon-si (KR); Yu-Sik Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 191 days.

(21) Appl. No.: 10/811,599

(22) Filed: Mar. 29, 2004

(65) Prior Publication Data

US 2005/0105911 A1    May 19, 2005

(30) Foreign Application Priority Data

Nov. 14, 2003   (KR) ............... 10-2003-0080505

(51) Int. Cl.
*G02B 6/12* (2006.01)
*G02B 6/34* (2006.01)
*G02B 6/00* (2006.01)

(52) U.S. Cl. .................... 385/14; 385/37; 385/147
(58) Field of Classification Search ............ 385/14, 385/37, 147
See application file for complete search history.

(56) References Cited

U.S. PATENT DOCUMENTS

| | | | | |
|---|---|---|---|---|
| 5,509,022 A * | 4/1996 | Lowery et al. | ............ | 372/18 |
| 5,557,166 A * | 9/1996 | Watase et al. | ............ | 313/524 |
| 5,835,650 A * | 11/1998 | Kitaoka et al. | ............ | 385/49 |
| 6,410,904 B1 * | 6/2002 | Ito et al. | ............ | 250/214 R |
| 6,536,957 B1 * | 3/2003 | Buchter | ............ | 385/89 |
| 6,562,693 B2 * | 5/2003 | Ichikawa et al. | ............ | 438/411 |
| 6,700,911 B2 * | 3/2004 | Kohashi et al. | ............ | 257/43 |
| 6,733,190 B2 * | 5/2004 | Kuhara et al. | ............ | 385/94 |
| 6,784,464 B2 * | 8/2004 | Ichikawa et al. | ............ | 257/99 |
| 6,940,091 B2 * | 9/2005 | Funada et al. | ............ | 257/21 |
| 2002/0028390 A1 * | 3/2002 | Mazed | ............ | 430/5 |
| 2002/0034834 A1 * | 3/2002 | Verdiell | ............ | 438/22 |
| 2003/0054558 A1 * | 3/2003 | Kurabayashi et al. | ............ | 436/63 |
| 2003/0165167 A1 * | 9/2003 | Ichikawa et al. | ............ | 372/36 |
| 2004/0037334 A1 * | 2/2004 | Funada et al. | ............ | 372/43 |
| 2004/0091011 A1 * | 5/2004 | Liu | ............ | 372/46 |
| 2005/0013337 A1 * | 1/2005 | Jung et al. | ............ | 372/50 |
| 2005/0057876 A1 * | 3/2005 | Kim | ............ | 361/103 |
| 2005/0067698 A1 * | 3/2005 | Aruga et al. | ............ | 257/737 |

FOREIGN PATENT DOCUMENTS

CN          1313661          9/2001

* cited by examiner

*Primary Examiner*—K. Cyrus Kianni
(74) *Attorney, Agent, or Firm*—Cha & Reiter, LLC

(57) ABSTRACT

A transistor-outline TO-can type optical module includes a stem, a sub-mount arranged in the stem and a laser diode (LD) is mounted in the sub-mount. A photo diode (PD), which has an inclined light incident surface, converts light emitted from the LD to current. A plurality of leads is extended through the stem while electrically being connected to the sub-mount. The inclined light incident surface of the PD permits that sufficient monitoring of photocurrent can be obtained and a p-side up bonding of a p-type electrode is allowed. Thus, the SMSR of the LOB is increased. A bias-tee is built in the TO-can to reduce heat caused by DC current and to increase opto-electric efficiency while suppressing an increase in the temperature of an LD chip.

19 Claims, 7 Drawing Sheets

TO-CAN TYPE OPTICAL MODULE

CLAIM FOR PRIORITY

This application claims priority under 35 U.S.C. § 119 to an application entitled "TO-Can Type Optical Module," filed in the Korean Intellectual Property Office on Nov. 14, 2003 and assigned Serial No. 2003-80505, the contents of which are incorporated herein by reference.

BACKGROUND OF THE INVENTION

1. Field of the Invention

The present invention relates generally to an optical module. More particularly, the present invention relates to a TO-can (Transistor-Outline-can) type optical module.

2. Description of the Related Art

An optical module is an essential part of any system used for optical transmission. Owing to the recent rapid growth of the information industry, there are increasing proportions of information transmission traveling over an optical communication network, as well as increased demand for fast transmission and transmission of a large volume of information. The optical module must be designed to support fast and large-volumes of information transmission. Optical devices such as a laser diode (LD) or a photodiode (PD) for the optical module are usually available in TO-can packages.

FIG. 1 is a perspective view of a conventional TO-can optical module package 100. Referring to FIG. 1, the conventional TO-can optical module package 100 comprises a stem 101 provided at a surface thereof, with a protruding heat sink block 111, and a plurality of leads 102. The four leads 102 comprise two leads for driving laser diode 103 and two leads for biasing monitor photodiode 104. The laser diode LD 103 and the monitoring photodiode MPD 104 are arranged on the surface the stem 101. In particular, LD 103 is normally arranged on the heat sink block 111. The LD 103 and the MPD 104 are connected to the leads 102 by, for example, wire bonding.

The leads 102 are coaxially aligned via through-holes 113 penetrating both surfaces of the stem 101, the through-holes 113 are filled with a glass sealant 105, and the glass sealant 105 is melted, thereby fixing the leads 102 to the stem 101 and sealing the through holes 113 at the same time. Such a conventional TO-can package is the model C-13-DFB10-TJ-SLC21 manufactured and sold by Luminent Inc.

However, the conventional optical module package is not practical for high-speed transmissions at 10 Gbps or over because of (1) parasitic inductance which is inherent in the leads, (2) parasitic capacitance between the leads and the stem, and (3) characteristic impedance mismatch for the RF signal passing through the leads.

FIG. 2 is a perspective view of another conventional TO-can optical module package 200 featuring a ceramic feed-through. Referring to FIG. 2, the TO-can optical module package 200 comprises a stem 201 provided with a protruding heat sink block 211, and a ceramic stack feed-through 203 inserted into the stem 201. The feed-through 203, disposed on the heat sink block 211, has a coplanar waveguide (CPW) 202 at a surface thereof. The CPW-type package 200 receives an external RF signal through a plurality of leads 204. TO TX PKG A2527 of Kyocera Corp. is one of such CPW-type packages.

The feed-through 203 is normally fabricated in a ceramic stack structure. Since the feed-through 203 is formed by LTCC (Low Temperature Co-fired Ceramic), its processing temperature is high, for example, between 800 and 1000° C. Thus, the manufacturing costs are higher than those of conventional TO-can optical module package shown in FIG. 1.

Moreover, when a waveguide structure is arranged with the optical module to improve the RF characteristics, the size of a sub-mount has to be increased. In this case, light emitted from the back facet of laser diode is reflected from or scattered on the surface of the sub-mount, resulting in a decrease of monitoring photocurrent. To solve this problem, Sumitomo Inc. proposed a TO-can type optical module package in which the sub-mount is shaped like "⊏". However, the conventional technology has distinctive shortcomings such as an increase in sub-mount manufacturing costs and a difficult assembly procedure. What makes it worse is that if a matching resistor is mounted on the sub-mount without any consideration of the other components, heat problems can become severe in case of un-cooled operation. When a mixture of a DC bias and an RF signal, produced from an external bias-tee, passes through the matching resistor, the heat dissipation mostly coming from DC current directly increases the operating temperature of the LD, which is located very close to the matching resistor, thereby deteriorates the performance of the TO-can type optical module in a fatal fashion.

SUMMARY OF THE INVENTION

The present invention substantially solves many of the above-mentioned problems and/or disadvantages of conventional TO-can optical modules, and provides additional advantages described, infra. The first aspect of present invention provides an optical module that has a high frequency response characteristic while still offering the benefits of a TO-can structure.

Another aspect of the present invention is to provide a TO-can type optical module that is manufactured easier than previously known structures with lower cost and higher throughput yields than those previously known.

The above aspects can be achieved by providing a TO-can type optical module that includes a stem; a sub-mount arranged in the stem and a laser diode LD is arranged in the sub-mount. A photodiode PD, which has an inclined light incident surface, converts light emitted from the LD to current. A plurality of leads is extended through the stem, and is electrically connected to the sub-mount.

It is preferable that a bias-tee is installed in the sub-mount so as to superpose an RF signal on the DC current for LD driving. In addition, a coplanar waveguide and a matching resistor are provided to transmit the RF signal without distortion, and an inductor serves as a choke to block the RF signal from a DC current path.

The present invention also includes a method of manufacturing the TO-can module.

BRIEF DESCRIPTION OF THE DRAWINGS

The above-mentioned and other aspects, features and advantages of the present invention will become more apparent from the following detailed description, when taken in conjunction with the accompanying drawings in which show that.

DETAILED DESCRIPTION OF THE INVENTION

Preferred aspects of the present invention will be described herein below with reference to the accompanying drawings. In the following description, well-known functions or constructions are not described in detail when it is believed that they would obscure detailed description of the invention with unnecessary detail that is known by the person of ordinary skill in the art.

Figure 1:
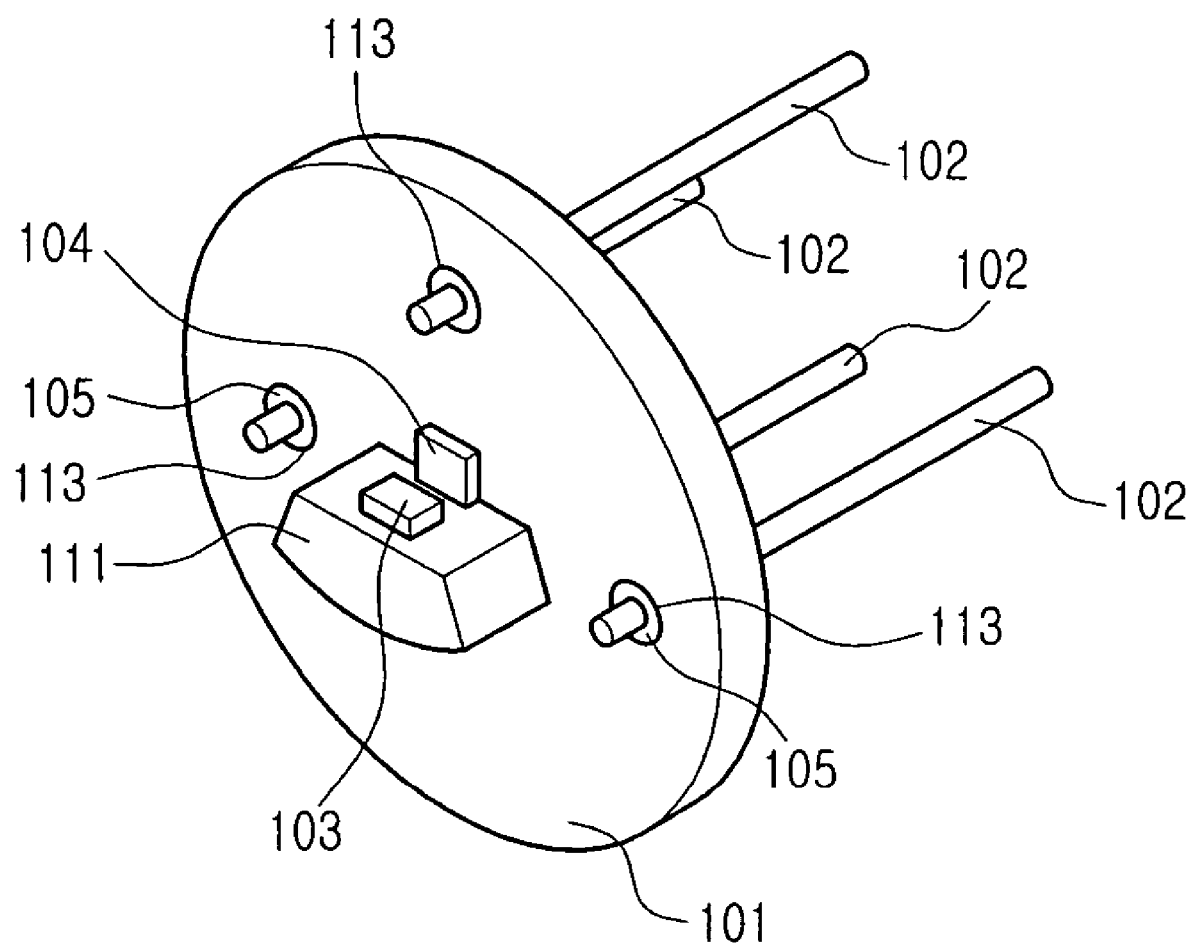
FIG. 1 illustrates a conventional TO-can type optical module package.
Figure 2:
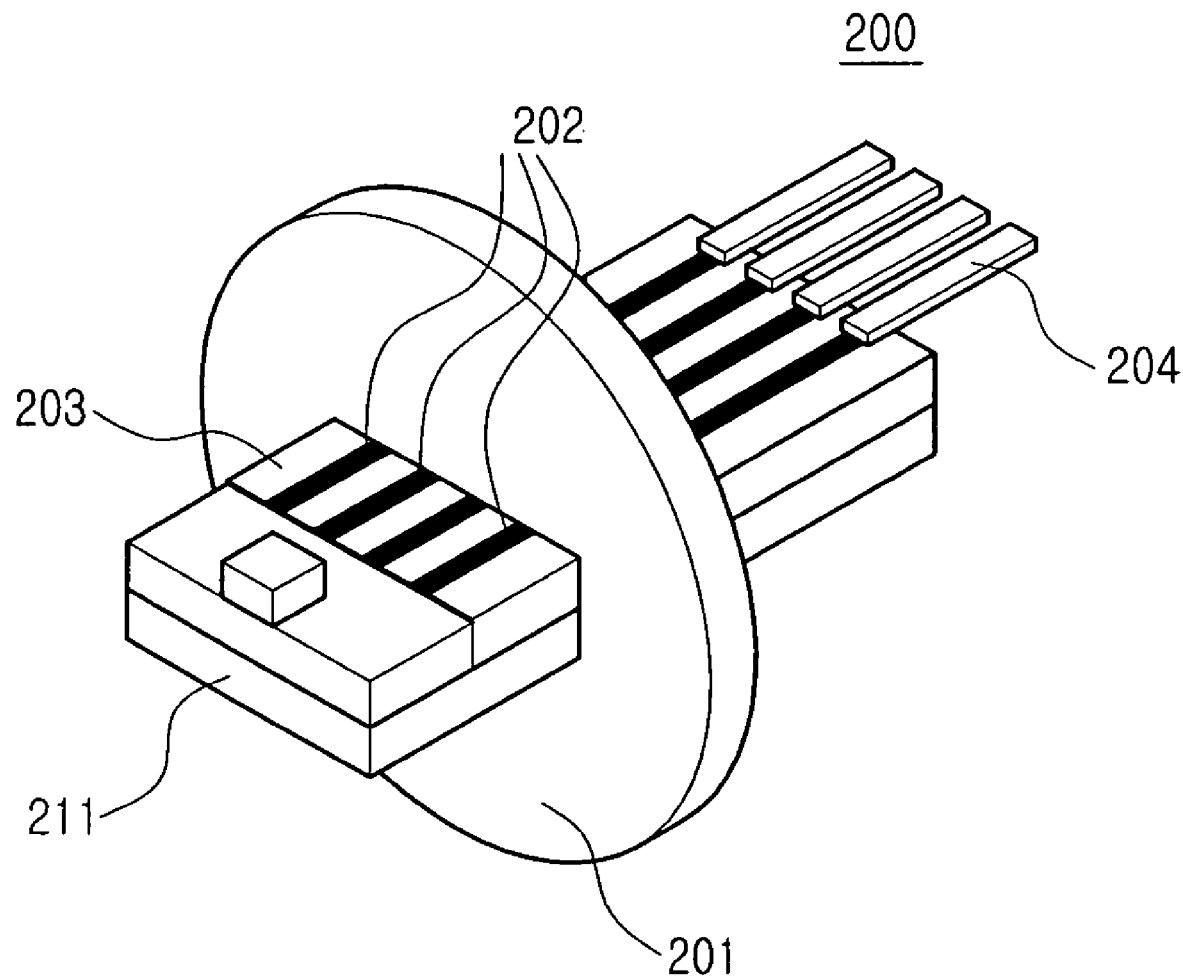
FIG. 2 illustrates another conventional TO-can type optical module package.
Figure 3:
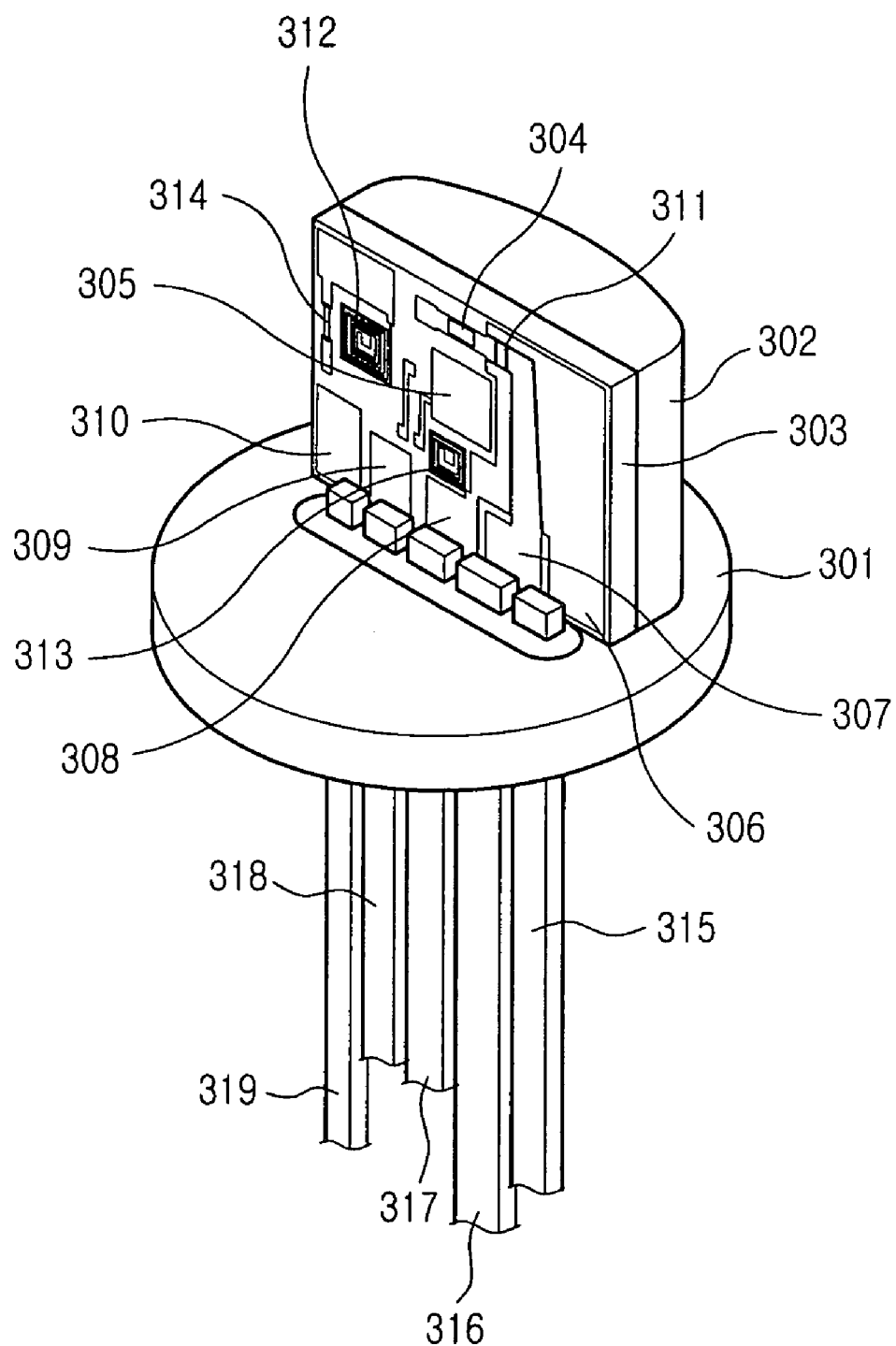
FIG. 3 illustrates a TO-can type optical module showing an aspect of the present invention.

FIG. 3 illustrates a TO-can type optical module according to an aspect of the present invention. In particular, attention is directed to the structure of a sub-mount for a DML (Direct Modulated Laser) driver or cathode driven type.

Referring to FIG. 3, a TO-can type optical module 300 according to the present invention comprises a stem 301, a heat sink 302, a sub-mount 303, an LD 304, a PD 305, and a plurality of leads 315 to 319. Further included is CPW composed of 306, 307 and 308, an anode line 309 for the PD 305, a DC line 310, a matching resistor 311, first and second spiral inductors 312 and 313, and a damping resistor 314.

The sub-mount 303 comprises a ceramic substrate that is die-bonded onto the heat sink 302 perpendicular to the upper surface of the stem 301. The ceramic substrate electrically isolates the conductive stem 301 so that a variety of electrical patterns can be formed on the sub-mount 303. Ceramic materials can include AlN, SiC, $Al_2O_3$, etc. In comparison to other ceramic materials, AlN exhibits excellent thermal conductivity and is therefore a favored material used as a sub-mount of a heat generator, such as an LD, a matching resistor and etc. The thermal conductivity of AlN is 2.1 W/cm° C., which is about twice as high as that of silicon, 0.84 W/cm° C. Also, an AlN sub-mount can be made thinner than a silicon sub-mount. Therefore, AlN is favorable in terms of thermal conductivity to the outside.

The LD 304 emits a laser beam depending on a DC bias or an RF signal. The CPW composed of 306, 307 and 308 together with the matching resistor, the PD line 309 and the DC line 310 are formed on the sub-mount 303 by thin-film processing. The matching resistor 311 is electrically connected to a signal line of the CPW 307. The CPW (composed of 306, 307 and 308) and the matching resistor 311 transfer an external 10-Gbps RF signal without distortions. 50 Ω is preferred to 25 Ω as the input impedance of the sub-mount 303 in terms of power consumption. The input impedance of the sub-mount 303 is the sum of the impedance of the matching resistor 311 and the dynamic resistance of the LD 304. The characteristic impedance of the CPW composed of 306, 307 and 308 is also matched to 25 Ω.

The first inductor 312 is a spiral type. It is connected to the DC line 310, functioning as a choke for blocking an RF signal from a DC path.

The second inductor 313 is positioned between the LD 304 and the PD 305. It isolates the LD 304 from the PD 305, thereby preventing unexpected RF signal leakage. The second inductor 313 is also spiral type like the first inductor 312. The matching resistor 311 and the first and second inductors 312 and 313 can be formed on the sub-mount 303 by thin-film processing. Therefore, a laser module package can be made compact.

The damping resistor 314 is connected in parallel to the first inductor 312 and prevents LC resonance caused by parasitic capacitance.

The leads 315 to 319 are inserted through the stem 301 such that one end of each of the leads 315 to 319 protrudes from one surface of the stem 301, while the other end thereof is extended through the other surface of the stem 301. The first lead 315 is connected to an anode of the LD 304, the second lead 316 to an cathode RF terminal of the LD 304, the third lead 317 to a cathode of the PD 305, the fourth lead to an anode of the PD 305, and the fifth lead 319 to a cathode DC terminal of the LD 304. The first and third leads 315 and 317 are commonly connected. The leads 315 to 319 are fixed to the stem 301 by a glass sealant filled in through holes. The glass sealant is filled in the state of glass seal powder into the through holes into which the leads 315 to 319 are aligned and melted at about 500° C., thereby sealing the through holes. Alternatively, a pre-shaped glass sealant can be prepared such a way that it can hold the leads 315 to 319 and can plugged into TO-stem 301. Then melting at about 500° C. completes the hermetic sealing of the through-hole.

A solder pattern (e.g., AuSn) is formed on the sub-mount 303, for die-bonding of the LD 304 and the PD 305. The structure of the sub-mount 303 may vary with the type of LD driver.

The PD 305 detects light emitted from the back face of the LD 304, determines whether the LD 304 is operating normally, and correspondingly performs an automatic power control (APC) operation. The PD 305 is an RMF (Reflection Mirror Facet) type MPD having the configuration illustrated in FIG. 4.

Figure 4:
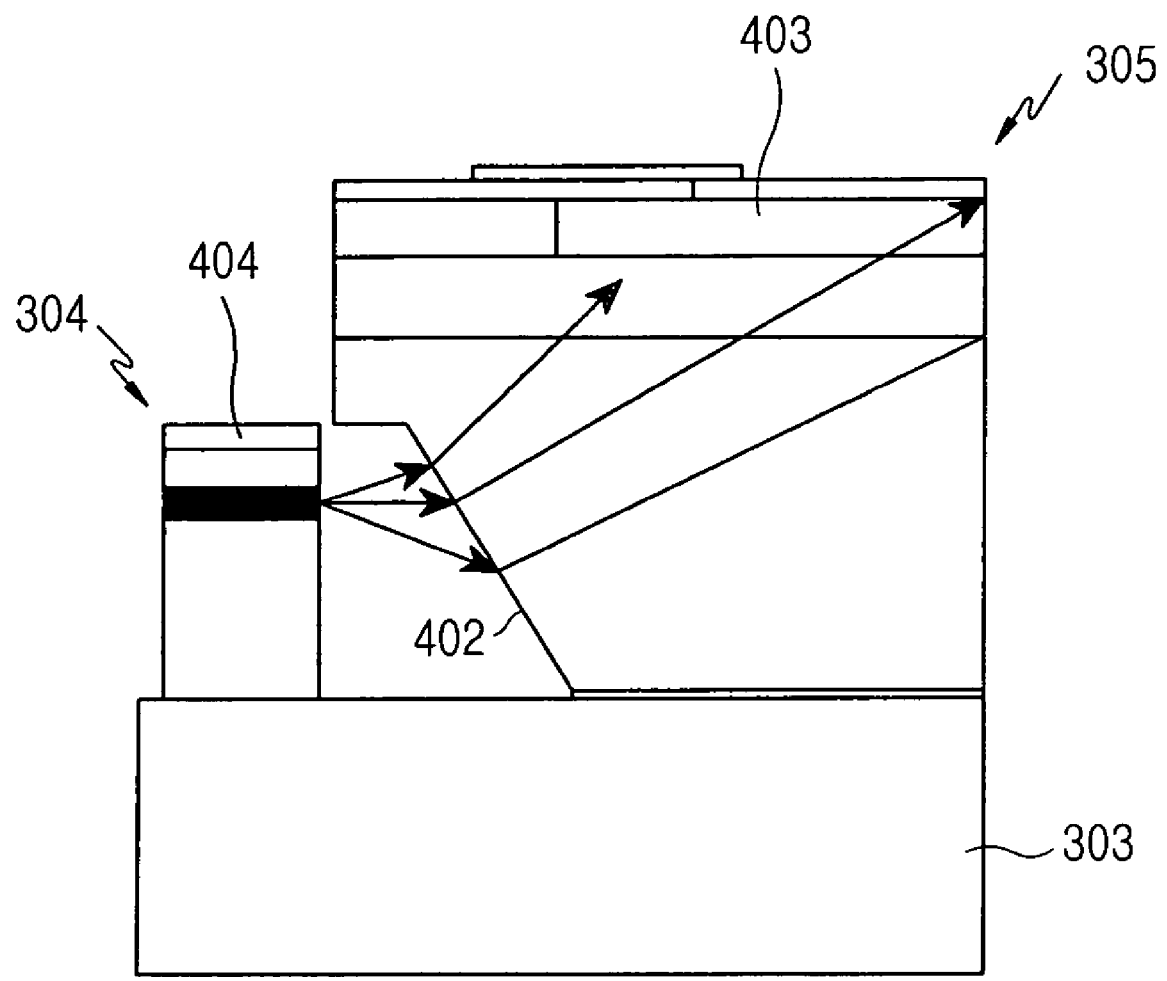
FIG. 4 illustrates a side view of the structure of a PD according to the present invention.

FIG. 4 schematically illustrates the structure of the RMF MPD 305. The light emitted from the LD 304 is incident on the RMP MPD 305 is shown in FIG. 4. Referring to FIG. 4, because the RMF MPD 305 has an inclined light incident surface 402, the reception efficiency of light reaching a light absorption layer 403 can be increased and so a sufficient monitoring photocurrent can be achieved.

Also, the light incident surface 402 allows p-side up bonding of a p-type electrode 404 of the LD 304, thereby increasing the SMSR (Side Mode Suppression Ratio) of the LOB (LD on Block). The SMSR of a DFB (Distributed Feed Back) laser varies with its bonding configuration. In general, it has higher SMSR in the case of p-side up bonding than p-side down bonding of a p-type electrode, showing a low bonding stress level.

This PD configuration suppresses a roll-off in electro-optic response, caused by the parasitic capacitance of a pad and thus improves RF characteristics. It further allows bonding of an LD and an MPD on a plane without V grooves as in SiOB process, simplifying sub-mount fabrication and assembly and eliminating the need for flip-chip bonding during die bonding.

Figure 5:
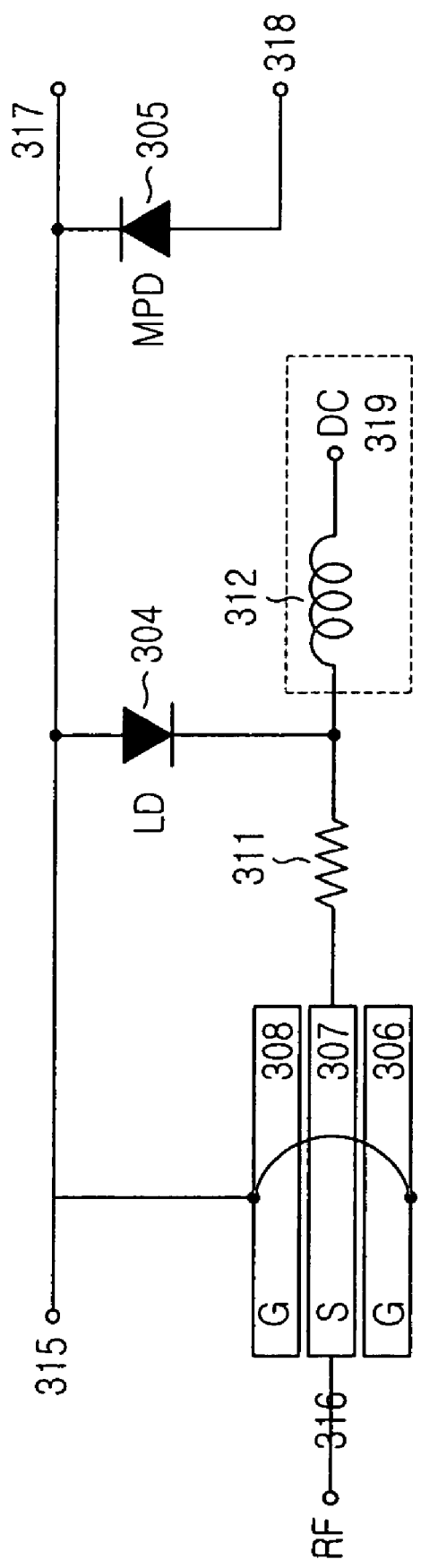
FIG. 5 is an equivalent circuit diagram of the TO-can type optical module that is cathode driven or for DML driver, as illustrated in FIG. 3.

FIG. 5 is an equivalent circuit diagram of the TO-can type optical module illustrated in FIG. 3. Here, the first lead 315 is shown being electrically connected to an anode of the LD 304, the second lead 316 to an anode RF terminal of the LD 304, the third lead 317 to a cathode of the PD 305, the fourth lead 318 to an anode of the PD 305, and the fifth lead 319 to a cathode DC terminal of the LD 304. The first and third leads 315 and 317 are commonly connected.

Figure 6:
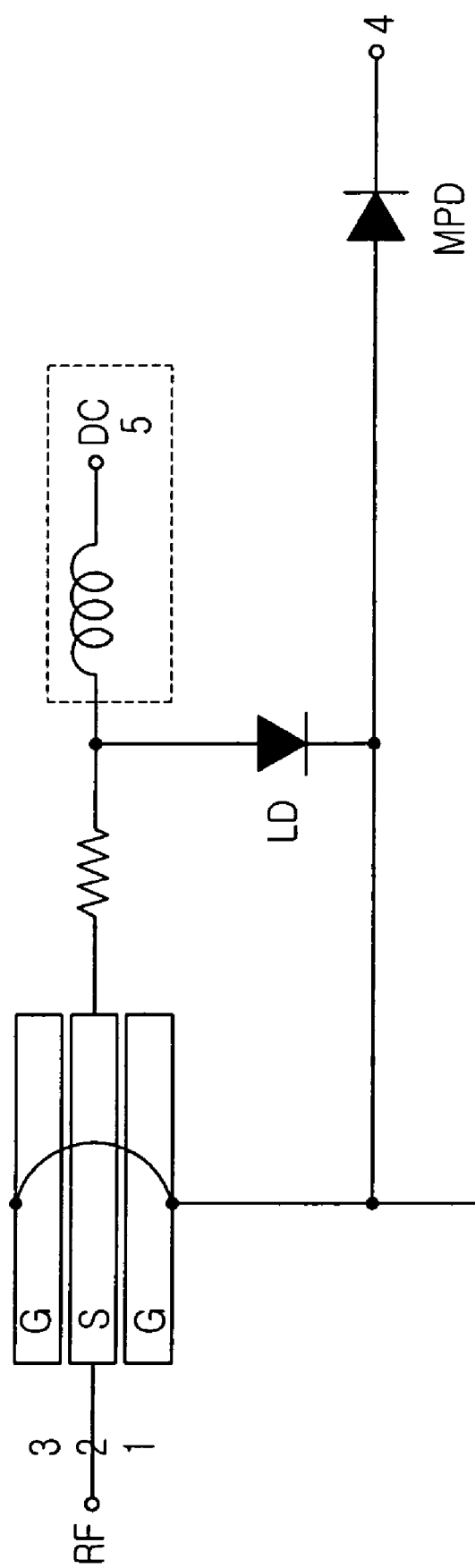
FIG. 6 illustrates a TO-can type optical module that is anode driven or for EML driver according to another aspect of the present invention.

FIG. 6 illustrates a TO-can type optical module according to yet another aspect of the present invention. Specifically, FIG. 6 is an equivalent circuit diagram of a sub-mount for an EML (Electro-absorptive Modulated Laser) driver or anode driven type.

Figure 7:
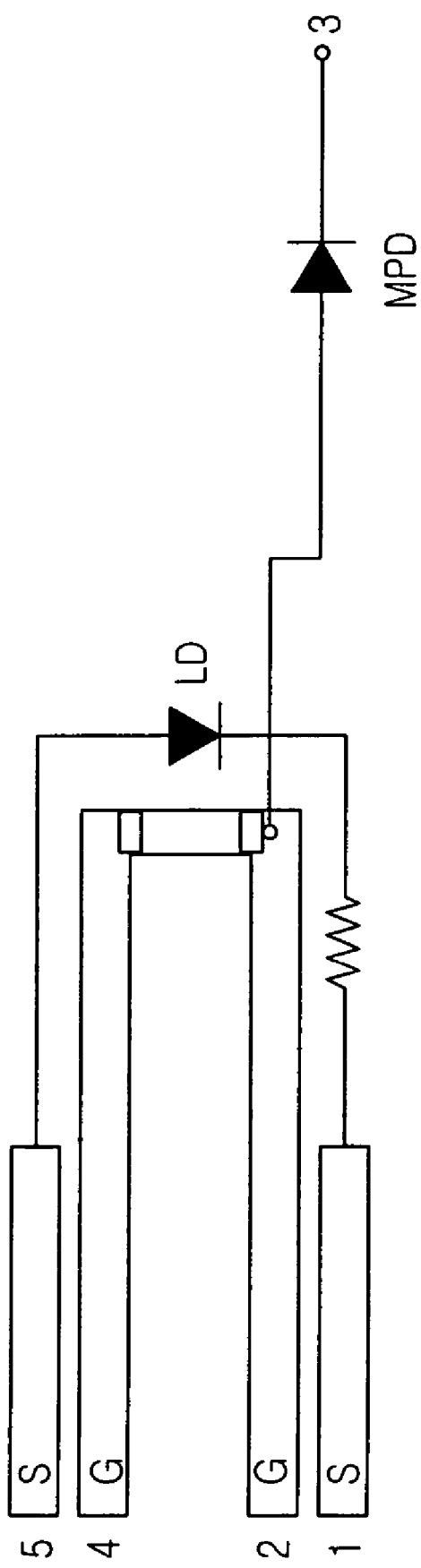
FIG. 7 illustrates a TO-can type optical module that is differentially driven according to a yet another aspect of the present invention.

FIG. 7 illustrates a TO-can type optical module according to still another aspect of the present invention. Specifically, FIG. 7 is an equivalent circuit diagram of a sub-mount for a differential type laser driver.

As described above, the present invention has the following advantages:

The use of a PD having an inclined light incident surface increases light reception efficiency and thus leads to a sufficient monitoring photocurrent. It also allows for the p-side up bonding of a p-type electrode in an LD, thereby increasing an SMSR. This PD structure suppresses a roll-off in electro-optic response caused by the parasitic capacitance of a pad, and so improves RF characteristics. Because an LD and a PD can be bonded on one plane without V grooves, assembly is simplified. Also, there is no need for flip-chip bonding for die bonding. Thus, process complexity is decreased and cost is reduced.

The reduction of heat generation by incorporating a bias-tee into a TO can increases opto-electric efficiency and suppresses a temperature increase of an LD chip. Integration of an inductor and a matching resistor formed by thin-film processing on a sub-mount renders an optical module compact.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A TO-can type optical module comprising:
    a stem;
    a sub-mount arranged in the stem;
    a laser diode (LD) mounted on the sub-mount;
    a photodiode (PD) mounted substantially parallel to the LD and said PD mounted on the submount, said PD having an inclined light incident surface, said PD being arranged for detecting light emitted from a back face of the LD converting light emitted from the LD to current; and
    a plurality of leads extended trough the stem, said leads electrically being connected to the sub-mount and said leads aligned in a row,
    wherein the sub-mount further includes;
        a bias-tee arranged in the sub-mount with the LD, the bias-tee superposing an RF signal onto a DC current of the LD; and
        a coplanar waveguide (CPW) and a matching resistor arranged in the sub-mount for transmitting the RF signal without distortion.

2. The TO-can type optical module of claim 1, wherein the sub-mount is arranged substantially perpendicular to an upper surface of the stem.

3. The TO-can type optical module of claim 1, further including an RF choke comprising a first inductor electrically connected to block the RF signal from a DC current path.

4. The TO-can type optical module of claim 3, further comprising a damping resistor electrically arranged in parallel with the first inductor.

5. The TO-can type optical module of claim 3, further comprising a second inductor connected electrically between the LD and the PD for providing RF isolation of the LD from the PD.

6. The TO-can type optical module of claim 5, wherein one of the first inductor and the second inductor comprises a spiral thin-film inductor.

7. The TO-can type optical module of claim 1, wherein the LD includes a type electrode bonded by having its p-side facing tip to the sub-mount.

8. The TO-can type optical module of claim 1, wherein the sub-mount is formed of a ceramic material.

9. The TO-can type optical module of claim 8, wherein the ceramic material comprises AlN.

10. The TO-can type optical module of claim 1, wherein the LD and the PD are die-bonded onto the sub-mount by a solder pattern.

11. The TO-can type optical module of claim 1, wherein the plurality of leads comprise a first lead connected to an anode of the LD, a second lead connected to a cathode RF terminal of the LD, a third lead connected to a cathode of the PD, a fourth lead connected to an anode of the PD, and a fifth lead connected to a cathode DC terminal of the LD.

12. The TO-can type optical module of claim 11, wherein the first and third leads are commonly connected.

13. The TO-can type optical module of claim 1, wherein the plurality of leads are arranged in line.

14. A TO-can type optical module comprising:
    a stem;
    a sub-mount arranged in the stem;
    a laser diode (LD) mounted on the sub-mount, said LD having a front and a back face;
    a photodiode (PD) mounted substantially parallel to the LD and said PD mounted on the submount, said PD having an inclined light incident surface, said PD being arranged for detecting light emitted from the back face of the LD to convert light emitted from the LD into current;
    a bias-tee arranged in the sub-mount for superposing an RF signal on the DC current of the LD; and
    a plurality of leads extended through the stem, said leads being connected electrically to the sub-mount and said leads aligned in a row,
    wherein, the sub-mount includes:
        a coplanar waveguide and a matching resistor arranged in the sub-mount for transmitting the RF signal without distortion, and
        an RF choke including an inductor arranged in a DC current path to block the RF signal from the DC current.

15. A method for providing a TO-can type optical module comprising the steps of:
    (a) providing a stem;
    (b) arranging a sub-mount in the stem substantially perpendicular to an upper surface of the stem;
    (c) arranging a laser diode (LD) on the sub-mount;
    (d) arranging a photodiode (PD) substantially parallel to the LD and said PD mounted on the submount, said PD having an inclined light incident surface, said PD being arranged for detecting light emitted from a back face of the LD to convert light omitted from the LD to current;
    (e) arranging a plurality of leads extended through the stem, said leads electrically being connected to the sub-mount and said leads aligned in a row; and
    (f) arranging a coplanar waveguide (CPW) and a matching resistor in the sub-mount for transmitting the RF signal without distortion.

16. The method according to claim 15, further comprising:
  (g) arranging a bias-tee in the sub-mount with the LD, said bias-tee superposing an RF signal onto a DC current of the LD.

17. The method according to claim 16, further comprising:
  (h) arranging an RF choke comprising a first inductor electrically connected to block the RF signal from the DC current path.

18. The method according to claim 17, further comprising:
  (i) electrically arranging a damping resistor in parallel with the first inductor.

19. The method according to claim 18 further comprising:
  (j) electrically arranging a second inductor between the LD and the PD for providing RF isolation of the LD from the PD.

* * * * *